United States Patent
Fukuda (10) Patent No.: US 9,054,147 B2
(45) Date of Patent: Jun. 9, 2015

(54) ALIGNMENT METHOD, ALIGNMENT APPARATUS, AND ORGANIC ELECTROLUMINESCENT (EL) ELEMENT MANUFACTURING APPARATUS

(75) Inventor: Naoto Fukuda, Chiba (JP)

(73) Assignee: CANON KABUSHIKI KAISHA, Tokyo (JP)

(*) Notice: Subject to any disclaimer, the term of this patent is extended or adjusted under 35 U.S.C. 154(b) by 347 days.

(21) Appl. No.: 13/270,520

(22) Filed: Oct. 11, 2011

(65) Prior Publication Data

US 2012/0103255 A1    May 3, 2012

(51) Int. Cl.
*G01B 11/00* (2006.01)
*H01L 21/68* (2006.01)
*C23C 14/04* (2006.01)
*C23C 14/54* (2006.01)
(Continued)

(52) U.S. Cl.
CPC .......... *H01L 21/682* (2013.01); *H01L 51/0012* (2013.01); *G01B 11/14* (2013.01); *C23C 14/042* (2013.01); *C23C 14/54* (2013.01); *H01L 51/0011* (2013.01)

(58) Field of Classification Search
CPC ......... G03F 7/709; G03F 9/70; G03F 9/7003; G03F 9/7019; G03F 9/7049; G03F 9/7023; G03F 9/7034; G03F 9/7038; G03F 9/7042; G01C 19/5712; G01C 19/5656; G01H 9/00; C23C 14/54; C23C 14/042; H01L 51/0011; H01L 51/0012; H01L 21/68; H01L 21/681; H01L 21/682; G01B 11/14
USPC ............. 356/399–401; 430/5, 22, 30; 355/53, 355/55, 57; 250/548; 382/151
See application file for complete search history.

(56) References Cited

U.S. PATENT DOCUMENTS 5,396,801 A * 3/1995 Komura .......................... 73/662
6,490,025 B1 * 12/2002 Makinouchi et al. ........... 355/53
(Continued)

FOREIGN PATENT DOCUMENTS

EP       0 866 374 A2    9/1998
JP    2008-0004358 A     1/2008
(Continued)

OTHER PUBLICATIONS

Korean Official Action dated Nov. 20, 2013, issued in corresponding Korean Patent Application No. 10-2011-0104930.

*Primary Examiner* — Kara E Geisel
*Assistant Examiner* — Hina F Ayub
(74) *Attorney, Agent, or Firm* — Fitzpatrick, Cella, Harper & Scinto (57) ABSTRACT

A method of carrying out alignment between a substrate and a mask, each having respective alignment marks. Vibrations attic substrate in a direction of gravity are measured. An antiphase vibrational wave is calculated, based an data corresponding to the measured vibrations. The antiphase vibrational wave is applied to the substrate, thereby reducing the vibrations or the substrate. When the vibrations of the substrate in the direction of gravity fall within a predetermined value that is set in advance, images are taken of relative positions of the alignment marks provided on the substrate and the mask, respectively, from the substrate side, and corresponding data is produced. Based on the data corresponding to the obtained images, an amount of movement of one of the substrate and the mask is calculated in a horizontal direction. One of the substrate and the mask is moved, based on the calculated movement amount.

16 Claims, 4 Drawing Sheets

(51) Int. Cl.
  *H01L 51/00* (2006.01)
  *G01B 11/14* (2006.01)

(56) References Cited

U.S. PATENT DOCUMENTS

| | | | |
|---|---|---|---|
| 7,037,012 B2* | 5/2006 | Karin et al. | 400/352 |
| 8,400,613 B2* | 3/2013 | Ishikawa | 355/53 |
| 2002/0006561 A1* | 1/2002 | Taniguchi | 430/22 |
| 2002/0080339 A1* | 6/2002 | Takahashi | 355/72 |
| 2003/0201404 A1* | 10/2003 | Shiraishi | 250/548 |
| 2005/0221203 A1* | 10/2005 | Fujii | 430/5 |
| 2008/0044744 A1* | 2/2008 | Yamazaki et al. | 430/5 |

FOREIGN PATENT DOCUMENTS

| | | |
|---|---|---|
| KR | 1998-080359 A | 11/1998 |
| KR | 20080005348 A | 1/2008 |

* cited by examiner

ALIGNMENT METHOD, ALIGNMENT APPARATUS, AND ORGANIC ELECTROLUMINESCENT (EL) ELEMENT MANUFACTURING APPARATUS

CLAIM OF PRIORITY

This application claims the benefit of Japanese Patent Application No. 2010-240757, filed Oct. 27, 2010, which is hereby incorporated by reference herein in its entirety.

BACKGROUND OF THE INVENTION

1. Field of the Invention

The present invention relates to an alignment method and an alignment apparatus for aligning, when an evaporation material is evaporated via a mask onto a substrate, the substrate and the mask with each other, and further, to an organic electroluminescent (EL) element manufacturing apparatus including the alignment apparatus.

2. Description of the Related Art

Generally, in an organic EL element, a hole transport layer, a light emitting layer, on electron transport layer, and the like, are formed as organic thin film layers between an anode formed of a transparent conductive film (for example, indium tin oxide (ITO)) and a cathode formed of a metal (for example, Al). An organic EL element is an electronic device that attains light emission by causing a hole injected from the anode side and an electron injected from the cathode side to recombine with each other in the light emitting layer via the hole transport layer and the electron transport layer, respectively.

In a manufacturing process of the organic EL element, a so-called mask evaporation method is known in which a mask is used to evaporate a specific material onto a substrate. By using the mask evaporation method, a red, green, or blue organic EL light emitting layer may be formed even in a very small region on the substrate. In the mask evaporation method, it is necessary to carry out an alignment operation between the substrate and the mask, and to evaporate an organic EL material at a predetermined position. Generally, the alignment operation is carried out by taking, with a camera, images of alignment marks provided en the substrate and the mask, respectively, processing the images, recognizing the positions thereof, and mechanically aligning the positions of the marks. Ordinarily, the alignment operation is carried out after the substrate is brought into an evaporation apparatus. A relative positional error between the alignment marks is determined immediately after the substrate is brought in when the substrate and the mask are away from each other, and when the substrate is brought into contact with the mask. In determining an error between the alignment marks after the substrate is brought into contact with the mask, when the error is outside a target error range, the substrate is once detached from the mask, and the alignment operation is carried out again.

In an organic EL element manufacturing apparatus using such an alignment method, as disclosed in Japanese Patent Application Laid-Open No. 2008-4358, there is known a method of improving the alignment accuracy based on the difference in calculated amount of movement during the alignment operation in an alignment step.

However, as described above, it is often the case that the alignment operation between substrate and the mask is carried out immediately after the substrate is brought in, and the positions of the alignment marks on the substrate and the mask are recognized using a camera with the substrate vibrating in the direction of gravity. When the substrate is vibrating in the direction of gravity, the alignment marks are seen as if the size thereof changes, which affects the recognition rate and the positional accuracy of the alignment marks after the image processing. The lowered recognition rate of the alignment marks may cause the error to be outside the target error range, and may cause the substrate and the mask to be repeatedly brought into contact with each other, which may result in damage of the substrate and the mask, an inconsistent processing time, and difficulty in improving the productivity.

SUMMARY OF THE INVENTION

Accordingly, an object of the present invention is to provide an alignment method and an alignment apparatus, in which the number of times to carry out the above-mentioned alignment operation is reduced, to reduce the damage of a substrate and a mask, and to improve the productivity of evaporation using the mask. Another object of the present invention is to provide an organic EL element manufacturing apparatus including the alignment apparatus.

According to a first aspect, the present invention provides a method of carrying out alignment between a substrate and a mask, including measuring vibrations of the substrate in a direction of gravity, based on data on the measured vibrations of the substrate in the direction of gravity, calculating an antiphase vibrational wave, applying the antiphase vibrational wave to the substrate, thereby reducing he vibrations of the substrate in the direction of gravity, and at a time when the vibrations of the substrate in the direction of gravity fall within a predetermined value that is set in advance, taking images of relative positions of alignment marks provided on the substrate and the mask, respectively, from the substrate side in the direction of gravity, and, based on data on the obtained substrate and the mask in a horizontal direction, and, based on data on the calculated amount of movement, moving the one of the substrate and the mask.

According to a second aspect, the present invention provides an alignment apparatus for carrying out alignment between a substrate and a mask, including an alignment unit for taking images of relative positions of alignment marks provided on the substrate and the mask, respectively, from the substrate side in a direction of gravity, and, based on data on the obtained images, calculating an amount of movement of one of the substrate and the mask in a horizontal direction, and, based on data on the calculated amount of movement, moving the one of the substrate and the mask, a vibration measuring unit for measuring vibrations of the substrate in the direction of gravity and a vibration cancelling unit for calculating an antiphase vibrational wave based on data on the vibrations of the substrate in the direction of gravity measured by the vibration measuring unit and applying the antiphase vibrational wave to the substrate, thereby reducing the vibrations of the substrate in the direction of gravity.

According to a third aspect, the present invention provides an organic EL element manufacturing apparatus for evaporating an organic material, which is generated from an evaporation source in a vacuum evaporation chamber, via a mask onto a film forming surface of a substrate, including the alignment apparatus according to the second aspect of the present invention.

According to the present invention, in carrying out the alignment operation between the substrate and the mask, the number of times the substrate and the mask are brought into contact with each other is reduced, and the time taken to carry out the alignment operation may be reduced. Therefore, damage of the substrate and the mask may be reduced, evaporation using a mask may be carried out with satisfactory productivity, and, in the organic EL element manufacturing apparatus according to the present invention, the manufacturing yield and the processing time of an organic EL element may be improved.

Further features of the present invention will become apparent from the following description or exemplary embodiments with reference to the attached drawings.

DESCRIPTION OF THE EMBODIMENTS

Preferred embodiments of the present invention will now be described in detail in accordance with the accompanying drawings.

An alignment method and an alignment apparatus according to the present invention relate to, in evaporation of an organic material via a mask onto a substrate in a vacuum evaporation chamber in an organic EL element manufacturing apparatus, alignment between the substrate and the mask. The alignment method according to the present invention has a feature in that, in the alignment between the substrate and the mask, vibrations of the substrate in the direction of gravity are measured and, based on the thus obtained vibration data, a vibrational wave in antiphase to the vibrations is applied to the substrate, to thereby reduce the vibrations occurring in the substrate. This may reduce the vibrations of the substrate when images of alignment marks provided on the substrate and the mask, respectively, are taken to determine the relative positions thereof, and may obtain more accurate image data. Therefore, the substrate and the mask may be aligned with each other with satisfactory accuracy in a non-contact state, which may reduce the number of times the substrate and the mask are detached from each other otter being in contact with each other for realignment. More specifically, by suppressing the number of times the substrate and the mask are repeatedly brought into contact and taken out of contact with each other, damage of the substrate and the mask due to the contact may be reduced, and the alignment may be carried out in a short period of time.

An embodiment of the present invention is described in the following with references to the attached drawings.

Figure 1:
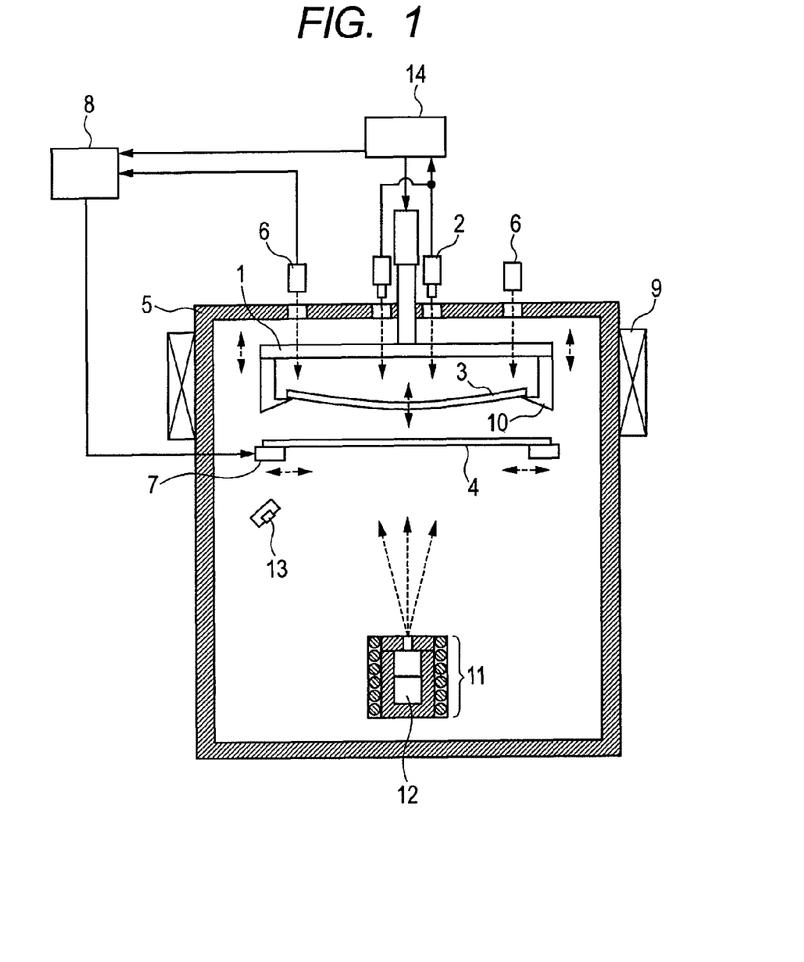
FIG. 1 is a schematic view illustrating a structure of an organic EL element manufacturing apparatus according to an embodiment of the present invention.

FIG. 1 is a schematic view illustrating a structure of an organic EL element manufacturing apparatus including an alignment apparatus according to an embodiment of the present invention.

The apparatus illustrated in FIG. 1 includes, in a vacuum chamber (vacuum evaporation chamber) 5, a substrate holding member 1 for holding a substrate 3 with a film forming surface thereof facing a mask 4 provided below, and a mask holding member 7 for holding the mask 4 on the film forming surface side of the substrate 3. In this embodiment, the substrate holding member 1 is movable in the direction of gravity, and the mask holding member 7 is adapted to move the mask 4 in a horizontal direction. Further, images of alignment marks provided on the substrate 3 and the mask 4, respectively, are taken by CCD cameras 6 in the direction of gravity of the substrate 3, and image processing is performed by an alignment control portion 8 to obtain image data. Then, based on the image data, the alignment control portion 8 checks the relative positions of the alignment marks, calculates the amount of movement of the mask 4 in the horizontal direction, and drives the mask holding member 7 based on data on the amount of movement to align the substrate 3 and the mask 4.

Then, the substrate holding member 1 is moved toward the mask 4 to bring the substrate 3 into contact with the mask 4. In this state, again, images of the alignment marks on the substrate 3 and the mask 4, respectively, are taken by the CCD cameras 6 and whether the positions are aligned or not (whether the alignment is completed or not) is checked. When the alignment is not completed, the substrate 3 and the mask 4 are again detached from each other, and the alignment in the non-contact state is repeated until the positions of the alignment marks are aligned with each other in a contact state.

Figure 2A:
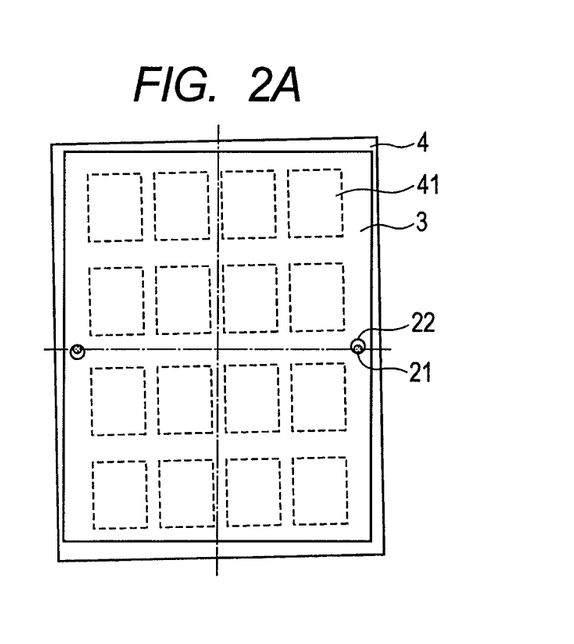
FIGS. 2A and 2B are schematic plan views illustrating alignment of alignment marks when a substrate and a mask are not in contact with each other in an alignment method according to the present invention.
Figure 2B:
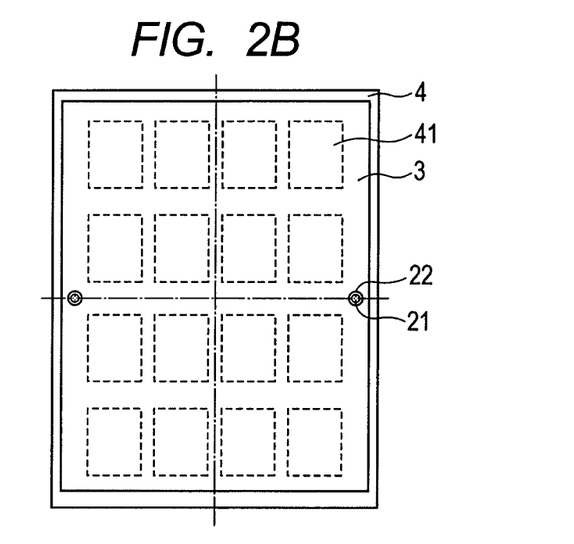

FIGS. 2A and 2B are schematic plan views illustrating the step of aligning the substrate 3 and the mask 4 with each other. In FIGS. 2A and 2B, alignment marks 21 (solid circles in the figures) are provided on the substrate 3, alignment marks 22 (hollow circles in the figures) are provided on the mask 4, and the mask 4 has apertures 41 provided herein. The substrate 3 is a transparent substrate, and thus, images of both of the alignment marks 21 and 22 may be taken by the CCD cameras 6 from a rear surface side of the substrate 3 as illustrated in FIG. 1. FIG. 2A illustrates a state before alignment, and the positions of the substrate 3 and the mask 4 are misaligned. From the taken images it the relative positions of the alignment marks 21 and 22 illustrated in FIG. 2A, the relative positions of the substrate 3 and the mask 4 are calculated, and the amount of movement of the mask 4 that is necessary to align the positions of the alignment marks 21 and the positions of the alignment marks 22 is calculated. Then, the mask 4 is moved by the calculated amount of movement. When the alignment is completed the state is as illustrated in FIG. 2B. Ordinarily, the alignment is completed when the positional error between the alignment marks 21 and 22 is in a predetermined range.

Note that, in this embodiment, the CCD cameras 6 are used in taking images of the alignment marks 21 and 22, but the image taking unit is not limited thereto. Further, in order to take accurate images of the alignment marks 21 and 22, the apparatus includes a light emitting unit (not shown), such as LED illumination. Further, the shapes of the alignment marks 21 and 22 are arbitrary insofar as the alignment marks 21 and 22 may be recognized in image processing and an alignment operation of the alignment marks 21 and 22 may be carried out. Further, in the embodiment illustrated in FIG. 1, the substrate holding member 1 is adapted to move in the direction of gravity while the mask holding member 7 is adapted to move in the horizontal direction, but the present invention is not limited thereto. It is enough that the apparatus includes a unit lot bringing the substrate 3 and the mask 4 into contact with each other, and moving the substrate 3 and the mask 4 our of contact from each other, and a unit for moving at least one of the substrate 3 and the mask 4 in the horizontal direction.

The substrate 3 vibrates in the direction of gravity immediately after the substrate 3 is brought into the chamber 5. Therefore, when the CCD cameras 6 for recognizing the alignment marks are used to try to recognize the alignment marks, the recognition rate of the alignment marks fluctuates. The alignment mark recognition rate is an error rate calculated by an alignment unit with respect to a reference value of the size of the alignment marks. The fluctuations of the alignment mark recognition rate due to the vibrations of the substrate 3 affect the accuracy and the repeatability of the alignment, and thus, are responsible for an increase in the number of times the substrate 3 and the mask 4 are brought into contact with each other. In this case, the processing time becomes inconsistent, which affects the post process operations.

According to the present invention, in order to reduce the vibrations of the substrate 3, the apparatus includes a vibration measuring unit and a vibration cancelling unit.

In the apparatus according to this embodiment, as the vibration measuring unit according to the present invention, a laser vibrometer 2 is included, which measures the vibrations in the direction of gravity of the substrate 3 that is brought into the apparatus. According to the present invention, it is desired that the vibration measuring unit can be an optical one such as the laser vibrometer 2 used in this embodiment, which is capable of measuring the vibrations from outside the chamber 5. When a loser vibrometer 2 is used as the vibration measuring unit, a window material that is pervious to light having a laser wavelength is provided on the chamber 5. Further, multiple vibration measuring units may be used in combination in order to measure the vibrations of the substrate 3 with accuracy.

The vibration data obtained by the measurement by the laser vibrometer 2 is sent to a vibration control portion 14 as the vibration cancelling unit. Based on the obtained vibration data, the vibration control portion 14 generates a vibrational wave in antiphase to the vibrations of the substrate 3. The antiphase vibrational wave is applied to the substrate 3 via a contact portion 10 of the substrate holding member 1, to thereby at least partially cancel and reduce the vibrations of the substrate 3. It is sufficient that the vibration cancelling unit according to the present invention includes a drive system, such as an actuator, and generates a wave in antiphase to the measured vibrational wave, so as to reduce the vibrations of the substrate 3. Further, it is also preferred that the contact portion 10 of the substrate holding member 1 be formed of an elastic material in order to reduce the vibrations of the substrate 3.

Even after the antiphase vibrational wave is applied to the substrate 3, the vibrations of the substrate 3 are measured by the laser vibrometer 2. When it is confirmed that the vibrations of the substrate 3 are within a predetermined value, which is set in advance, a signal is sent from the vibration control portion 14 to the alignment control portion 8, and the alignment between the substrate 3 and the mask 4 is carried out. According to the present invention, the predetermined value allowable for the vibrations of the substrate 3 in the direction of gravity is a minimum vibration range at an alignment position of the organic EL element manufacturing apparatus. More specifically, the minimum vibration range relates to vibrations that occur depending on the environment of the apparatus and vibrations of a pump, and the like, connected to the apparatus. Vibrations in the minimum vibration range due to bringing the substrate 3 into the chamber 5 are applied immediately after the substrate 3 is brought into the chamber 5. According to the present invention, such vibrations due to bringing the substrate 3 into the chamber 5 are reduced by the vibration cancelling unit.

The minimum vibration range is obtained by leaving the substrate 3 for thirty minutes or lower in a state in which the substrate 3 is held at the alignment position in an ordinary operating status (state in which the images of the alignment marks 21 and 22 of the substrate 3 and the mask 4 are taken in at non-contact state) and, thereafter, measuring the vibrations of the substrate 3 in the direction of gravity by the laser vibrometer 2. The measurement is carried out for a fixed time period, and the mean value is determined.

The organic EL element manufacturing apparatus according to the present invention has the feature of including an alignment apparatus that includes the vibration measuring unit and the vibration cancelling unit, in addition to the above-mentioned alignment unit, including the alignment control portion 8 and a unit for driving the substrate holding member 1 and the mask holding member 7. Further, the organic EL element manufacturing apparatus according to the present invention includes an evaporation source 11 for generating vapors of an evaporation material 12 for forming an organic EL layer of an organic EL element such as tris (8-hydroxyquinolinato) aluminium (Alq3) as illustrated in FIG. 1. Vapors of the evaporation material 12 generated from the evaporation source 11 deposit via the mask 4 on the film forming surface of the substrate 3 to form an evaporation film. The velocity at which vapors generated from the evaporation source 11 deposit on the substrate 3 and the mask 4 is monitored by a film thickness sensor 13 and the amount of vapors is controlled. The film thickness sensor 13 may be provided with a pipe, a shield plate, and the like, as necessary. It is desired that the film thickness sensor 13 be provided in proximity to the substrate 3, but the present invention is not limited thereto. Further, a shutter (not shown) may be provided between an opening of the evaporation source 11 and the film forming surface of the substrate 3. If such a shutter is provided at the opening of the evaporation source 11, vapors coming through the opening may be freely shut off. Further, it is desired to use, as a vacuum exhaust system (not shown) for exhausting the chamber 5, a vacuum pump that has the ability of promptly exhausting the chamber to high vacuum.

Further, the organic EL element manufacturing apparatus according to the present invention may be further joined to other vacuum apparatus via a gate valve 9, and other process steps for manufacturing an organic EL element may be carried out in such other vacuum apparatus. When the substrate is a large-sized substrate, it is desired to use multiple evaporation sources 11 to form a uniform evaporation film with little film thickness variation on the film forming surface of the substrate 3. The areas, the shapes, the materials, and the like, of the openings of the evaporation sources 11 may vary, and the openings may take various shapes, including a circle, a rectangle, and an oval. By varying the areas and the shapes of the opening, the film thickness controllability on the substrate 3 may be improved move. When a highly accurate mask is sued as the mask 4 and a line pattern is formed by evaporation using the mask, the film formation may be carried out with the evaporation source 11 being moved by a drive unit taking into account the effect of heat on the mask 4. Further, the film formation may he carried out with the substrate 3 and the mask 4 being moved by a drive unit.

Figure 3:
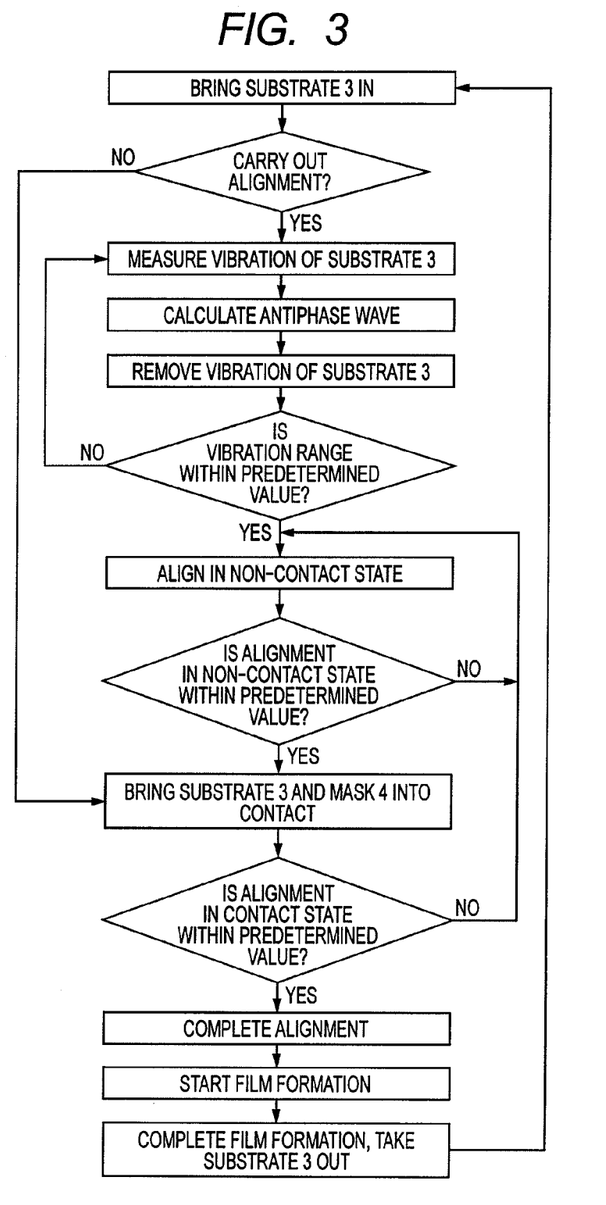
FIG. 3, is a flow chart illustrating process steps in the organic EL element manufacturing apparatus according to the present invention.

FIG. 3 is a flow chart illustrating process steps of the organic EL element manufacturing apparatus according to the present invention. As illustrated in FIG. 3, after the substrate 3 is brought in, first, whether to carry out the alignment step or not is determined. Here, the substrate 3 and the mask 4 are held in the non-contact state. When the alignment step is carried out, the vibrations of the substrate 3 in the direction of gravity are measured by the vibration measuring unit. The measurement values (vibration data) are sent to the vibration cancelling unit, in which an antiphase vibrational wave is calculated, and the vibrational wave is applied to the substrate 3 by an actuator (not shown) provided in the vibration cancelling unit, to thereby reduce the vibrations of the substrate 3. At the time when the vibration range of the substrate 3 falls within the predetermined value, the positions of the alignment marks on the substrate side and the alignment marks on the mask side are aligned using the alignment unit with the substrate 3 and the mask 4, in the non-contact state. At the time when the relative positions of the respective alignment marks in the non-contact state fall within a predetermined value, the substrate 3 and the mask 4 are brought into contact with each other. The relative positions of the alignment marks on the substrate side and the alignment marks on the mask side in the contact state are measured using the alignment unit. When the relative positions are within a predetermined value in the contact state, the alignment step is completed. After the alignment step is completed, the evaporation source 11 is used to form a film on the substrate 3. After the film formation is completed, the substrate 3 is taken out, and the next substrate 3 is brought in.

EXAMPLE

The organic EL element manufacturing apparatus illustrated in FIG. 1 was used to carry out evaporation process steps. First, a glass substrate of 370 mm×470 mm×0.7 mm was set in a substrate stocking device (not shown) that was joined to the chamber 6 via the gate valve 9, and the substrate stocking device was exhausted by a vacuum exhaust system (not shown) until the pressure was reduced to $1.0 \times 10^{-4}$ Pa or lower. The chamber 5 was also exhausted by a vacuum exhaust system (not shown) until the pressure was reduced to $0.0 \times 10^{-4}$ Pa or lower. After the exhausting, the substrate 3 was brought into the chamber 5 from substrate stocking device (not shown) via the gate valve 9 using a substrate transfer mechanism (not shown).

Immediately after the substrate 3 was brought into the chamber 5, even visually, it was confirmed that the substrate 3 was vibrating in the direction of gravity. Therefore, according to the flow chart illustrated in FIG. 3, the vibrations were cancelled, and then, the alignment was carried out. The distance between the substrate 3 and the mask 4 immediately after the substrate 3 was brought in was 4.5 mm, the diameter of the alignment marks on the substrate 3 was 0.3 mm, the diameter of the alignment marks on the mask 4 was 0.5 mm, and the distance from the rear surface of the substrate 3 to the CCD cameras 6 was 200 mm. Further, the predetermined value tor the vibration range (i.e., minimum vibration range) was set to about 2.0 mm±0.3 mm, corresponding to the warpage due to the substrate's own weight. The predetermined value for the alignment between the substrate 3 and the mask 4 in the non-contact state was set to ±5.0 μm.

Figure 4:
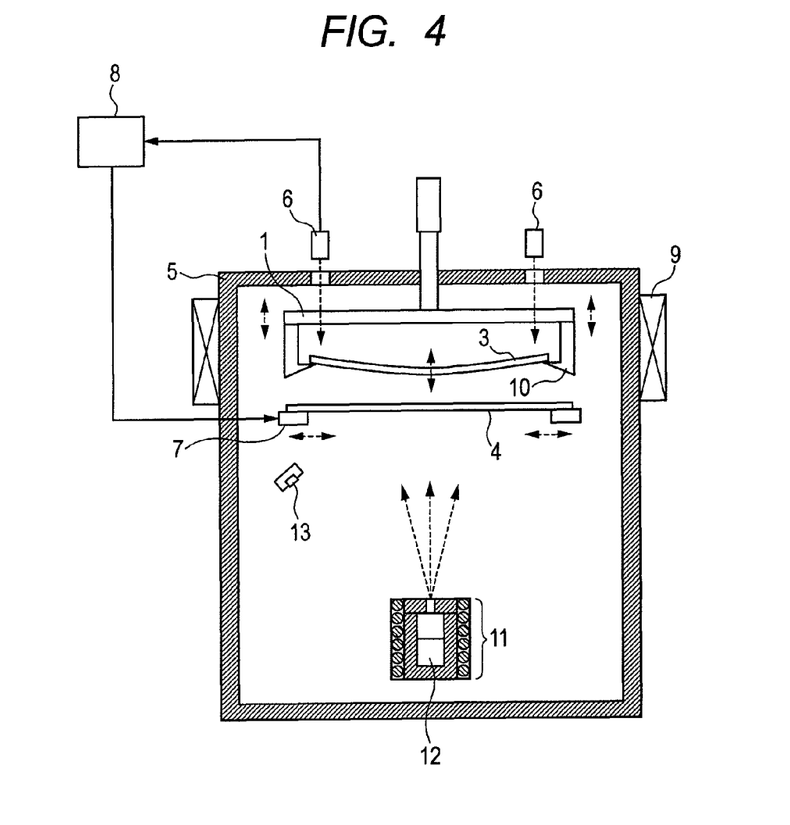
FIG. 4 is a schematic view illustrating an exemplary structure of a conventional organic EL element manufacturing apparatus.

The alignment mark recognition rate when the substrate 3 was supported by a conventional apparatus that did not cancel the vibrations of the substrate 3 as illustrated in FIG. 4 was 90% to 95%. On the other hand, in the apparatus according to the present invention illustrated in FIG. 1, as described above, an antiphase vibrational wave was calculated in real time with respect to the vibration data obtained using the vibration measuring unit, and the calculated vibrational wave was applied to the substrate 3. Whether the vibrations of the substrate 3 in the direction of gravity were cancelled by the vibration cancelling unit or not was determined by the vibration measuring unit. It was made clear that the vibrations of the substrate 3 were reduced, and the improvement by 1% to 2% was observed in the alignment mark recognition rate calculated by the alignment unit after the vibrations were reduced. By the improvement of the alignment mark recognition rate, the alignment accuracy was improved, and the number of times the alignment was carried out until the alignment fell in the predetermined value was reduced. As described above, according to the present invention, the recognition rate of the alignment marks provided on the substrate 3 and the mask 4 was improved, and the alignment accuracy was improved, and the number of times the alignment was carried out was reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of carrying out alignment between a substrate and a mask, the substrate and the mask having respective alignment marks, the method comprising:
   irradiating the substrate with laser light and to measure vibrations of the substrate in a direction of gravity to produce vibration data;
   producing an antiphase vibrational wave, based on the corresponding vibration data produced in the irradiating step;
   applying the antiphase vibrational wave to the substrate, thereby reducing the vibrations of the substrate in the direction of gravity;
   at a time when the measured vibrations of the substrate in the direction of gravity fall within a predetermined value that is set in advance, taking images of relative positions of the respective alignment marks provided on the substrate and the mask, from the substrate side, in the direction of gravity, and producing data corresponding to the obtained images;
   calculating an amount of movement of one of the substrate and the mask in a horizontal direction, based on the data corresponding to the obtained images; and
   moving the one of the substrate and the mask, based on the calculated amount of movement.

2. An alignment apparatus for carrying out alignment between a substrate and a mask, the substrate and the mask having respective alignment marks, the alignment apparatus comprising:
   an alignment unit including (a) a substrate holder for holding an end portion of the substrate, (b) a mask holder for holding an end portion of the mask, (c) a plurality of cameras for (i) taking images of relative positions of the respective alignment marks provided on the substrate and the mask, from the substrate side, in a direction of gravity, and (ii) producing corresponding positional data, and (d) an alignment controller for (i) calculating an amount of movement of one of the substrate and the mask in a horizontal direction based on the corresponding positional data, and (ii) moving the one of the substrate holder and the mask holder, based on the calculated amount of movement;
   an optical measuring instrument for irradiating the substrate with laser light to measure vibrations of the substrate in the direction of gravity to produce vibration data; and
   a vibration cancelling unit, including a drive system, that (i) calculates an antiphase vibrational wave based on the vibration data corresponding to the vibrations of the substrate in the direction of gravity measured by the optical measuring instrument, and (ii) applies the antiphase vibrational wave to the substrate, thereby reducing the vibrations of the substrate in the direction of gravity.

3. The alignment apparatus according to claim 2, wherein the substrate holder includes an elastic member, such that the vibration cancelling unit applies the antiphase vibrational wave to the substrate via the elastic member.

4. An organic electroluminescent (EL) element manufacturing apparatus for evaporating an organic material, which is generated from an evaporation source in a vacuum evaporation chamber, via a mask onto a film forming surface of a substrate, the organic electroluminescent (EL) element manufacturing apparatus comprising:

the alignment apparatus according to claim 2.

5. The alignment apparatus according to claim 2, wherein the optical measuring instrument is a laser vibrometer.

6. The method of claim 1, wherein the substrate is held by a substrate holder comprising an elastic member, such that the antiphase vibrational wave is applied to the substrate via the elastic member.

7. The method of claim 1, further comprising evaporating an organic material, which is generated from an evaporation source in a vacuum evaporation chamber, via the mask onto a film forming surface of the substrate.

8. The method of claim 1, wherein the vibrations of the substrate are measured with a laser vibrometer.

9. A method of carrying out alignment between a substrate and a mask, the substrate and the mask having respective alignment marks, the method comprising:

measuring vibrations of the substrate in a direction of gravity to produce vibration data, the vibrations of the substrate being relative to a position of the mask in the direction of gravity;

producing an antiphase vibrational wave, based on the corresponding vibration data produced in the measuring step;

applying the antiphase vibrational wave to the substrate, thereby reducing the vibrations of the substrate in the direction of gravity;

at a time when the measured vibrations of the substrate in the direction of gravity fall within a predetermined value that is set in advance, taking images of relative positions of the respective alignment marks provided on the substrate and the mask, from the substrate side, in the direction of gravity, and producing data corresponding to the obtained images;

calculating an amount of movement of one of the substrate and the mask in a horizontal direction, based on the data corresponding to the obtained images; and moving the one of the substrate and the mask, based on the calculated amount of movement.

10. The method of claim 9, wherein the substrate is held by a substrate holder comprising an elastic member, such that the antiphase vibrational wave is applied to the substrate via the elastic member.

11. The method of claim 9, further comprising evaporating an organic material, which is generated from an evaporation source in a vacuum evaporation chamber, via the mask onto a film forming surface of the substrate.

12. The method of claim 9, wherein the vibrations of the substrate are measured with a laser vibrometer.

13. An alignment apparatus for carrying out alignment between a substrate and a mask, the substrate and the mask having respective alignment marks, the alignment apparatus comprising:

an alignment unit including (a) a substrate holder for holding an end portion of the substrate, (b) a mask holder for holding an end portion of the mask, (c) a plurality of cameras for (i) taking images of relative positions of the respective alignment marks provided on the substrate and the mask, from the substrate side, in a direction of gravity, and (ii) producing corresponding positional data, and (d) an alignment controller for (i) calculating an amount of movement of one of the substrate and the mask in a horizontal direction based on the corresponding positional data, and (ii) moving the one of the substrate holder and the mask holder, based on the calculated amount of movement;

an optical measuring instrument for measuring vibrations of the substrate in the direction of gravity to produce vibration data, the vibrations of the substrate being measured relative to a position of the mask in the direction of gravity; and a vibration cancelling unit, including a drive system, that (i) calculates an antiphase vibrational wave based on the vibration data corresponding to the vibrations of the substrate in the direction of gravity measured by the optical measuring instrument, and (ii) applies the antiphase vibrational wave to the substrate, thereby reducing the vibrations of the substrate in the direction of gravity.

14. The alignment apparatus according to claim 13, wherein the substrate holder includes an elastic member, such that the vibration cancelling unit applies the antiphase vibrational wave to the substrate via the elastic member.

15. An organic electroluminescent (EL) element manufacturing apparatus for evaporating an organic material, which is generated from an evaporation source in a vacuum evaporation chamber, via a mask onto a film forming surface of a substrate, the organic electroluminescent (EL) element manufacturing apparatus comprising:

the alignment apparatus according to claim 13.

16. The alignment apparatus according to claim 13, wherein the optical measuring instrument is a laser vibrometer.

* * * * *